(12) United States Patent
Bauchot et al.

(10) Patent No.: US 8,798,797 B2
(45) Date of Patent: Aug. 5, 2014

(54) AIR PRESSURE MEASUREMENT BASED COOLING

(75) Inventors: Frederic Bauchot, Saint-Jeannet (FR);
Jean-Yves Clement, Saint-Jeannet (FR);
Jean-Marc Legrand, Cagnes sur Mer (FR)

(73) Assignee: International Business Machines Corporation, Armonk, NY (US)

( * ) Notice: Subject to any disclaimer, the term of this patent is extended or adjusted under 35 U.S.C. 154(b) by 340 days.

(21) Appl. No.: 13/251,389

(22) Filed: Oct. 3, 2011

(65) Prior Publication Data

US 2013/0048266 A1 Feb. 28, 2013

(30) Foreign Application Priority Data

Aug. 25, 2011 (EP) .................................... 11290382

(51) Int. Cl.
| | | |
|---|---|---|
| *G01M 1/38* | (2006.01) | |
| *G05B 13/00* | (2006.01) | |
| *G05B 21/00* | (2006.01) | |
| *G05B 15/00* | (2006.01) | |
| *G05D 23/00* | (2006.01) | |
| *G05D 16/00* | (2006.01) | |

(52) U.S. Cl.
USPC ............ 700/276; 700/277; 700/299; 700/301

(58) Field of Classification Search
USPC ................................. 700/276, 277, 299, 301
See application file for complete search history.

(56) References Cited

U.S. PATENT DOCUMENTS

| 6,694,759 | B1* | 2/2004 | Bash et al. ...................... 62/180 |
| 8,180,495 | B1* | 5/2012 | Roy ............................... 700/278 |
| 8,498,114 | B2* | 7/2013 | Martini .......................... 361/695 |
| 2009/0034187 | A1 | 2/2009 | Coles et al. |
| 2010/0107658 | A1 | 5/2010 | Cockrell |
| 2011/0128699 | A1* | 6/2011 | Heydari et al. .......... 361/679.48 |
| 2011/0195652 | A1* | 8/2011 | Smith ........................... 454/184 |

FOREIGN PATENT DOCUMENTS

WO WO2010131954 A1 11/2010

\* cited by examiner

*Primary Examiner* — Ronald Hartman, Jr.
(74) *Attorney, Agent, or Firm* — Schmeiser, Olsen & Watts; John Pivnichny

(57) ABSTRACT

A cooling management system including component racks, a cooling system, pressure measurement devices, and a computing system within a structure. Each component rack includes an exothermic apparatus. The structure includes warm air aisle spaces and cold air aisle spaces located between the component racks. The cooling system feeds cold air into each cold air aisle space. The cold air flows through the component racks resulting in displacement of warm air from each exothermic apparatus. The warm air flows into the warm air aisle spaces and is directed back to the cooling system. The pressure measurement devices measure differential pressure values between the cold air aisle spaces and the warm air aisle spaces. The computing system monitors the differential pressure values, perform calculations associated with the differential pressure values, and control a fan speed of at least one fan within the cooling system based on the calculations.

23 Claims, 7 Drawing Sheets

AIR PRESSURE MEASUREMENT BASED COOLING

TECHNICAL FIELD

The present invention relates to a system and associated method for using air pressure measurements to control a cooling system.

BACKGROUND

Cooling structures typically comprises an inefficient process with little flexibility. Accordingly, there exists a need in the art to overcome the deficiencies and limitations described herein above.

SUMMARY

The present invention provides a system comprising: a plurality of component racks located within a structure, wherein each component rack of the plurality of component racks comprises at least one exothermic apparatus, wherein the structure comprises a plurality of warm air aisle spaces and a plurality of cold air aisle spaces located between the plurality of component racks; a cooling system within the structure, wherein the cooling system is configured to feed cold air into each cold air aisle space of the plurality of cold air isle spaces, wherein the cold air flows through the component racks resulting in displacement of warm air from each of the at least one exothermic apparatus, and wherein the warm air flows into the plurality of warm air aisle spaces and is directed back to the cooling system; a plurality of pressure measurement devices configured to measure differential pressure values between the plurality of cold air aisle spaces and the plurality of warm air aisle spaces; and a computing system configured to monitor the differential pressure values, perform calculations associated with the differential pressure values, and control a fan speed of at least one fan within the cooling system based on the calculations.

The present invention provides a method comprising: providing a system comprising a plurality of component racks located within a structure, a cooling system within the structure, a plurality of pressure measurement devices within the structure, and a computing system connected to the plurality of pressure measurement devices, wherein each component rack of the plurality of component racks comprises at least one exothermic apparatus, wherein the structure comprises a plurality of warm air aisle spaces and a plurality of cold air aisle spaces located between the plurality of component racks; feeding, by the cooling system, cold air into each cold air aisle space of the plurality of cold air isle spaces, wherein the cold air flows through the component racks resulting in displacement of warm air from each exothermic apparatus, and wherein the warm air flows into the plurality of warm air aisle spaces and is directed back to the cooling system; measuring, by the plurality of pressure measurement devices, differential pressure values between the plurality of cold air aisle spaces and the plurality of warm air aisle spaces; and monitoring, by the computing system, the differential pressure values; performing, by the computing system, calculations associated with the differential pressure values; and controlling, by the computing system, a fan speed of at least one fan within the cooling system based on the calculations.

The present invention provides a computer program product, comprising a computer readable storage medium having a computer readable program code embodied therein, the computer readable program code comprising an algorithm that when executed by a computer processor of a computing system implements a method for controlling a system comprising a plurality of component racks located within a structure, a cooling system within the structure, and a plurality of pressure measurement devices within the structure, wherein each component rack of the plurality of component racks comprises at least one exothermic apparatus, and wherein the structure comprises a plurality of warm air aisle spaces and a plurality of cold air aisle spaces located between the plurality of component racks, the method comprising: feeding, by the cooling system, cold air into each cold air aisle space of the plurality of cold air isle spaces, wherein the cold air flows through the component racks resulting in displacement of warm air from each exothermic apparatus, and wherein the warm air flows into the plurality of warm air aisle spaces and is directed back to the cooling system; measuring, by the plurality of pressure measurement devices, differential pressure values between the plurality of cold air aisle spaces and the plurality of warm air aisle spaces, wherein the computing system is connected to the plurality of pressure measurement devices monitoring, by the computing system, the differential pressure values; performing, by the computing system, calculations associated with the differential pressure values; and controlling, by the computing system, a fan speed of at least one fan within the cooling system based on the calculations.

The present invention advantageously provides a simple method and associated system capable of cooling structures.

DETAILED DESCRIPTION

Figure 1:
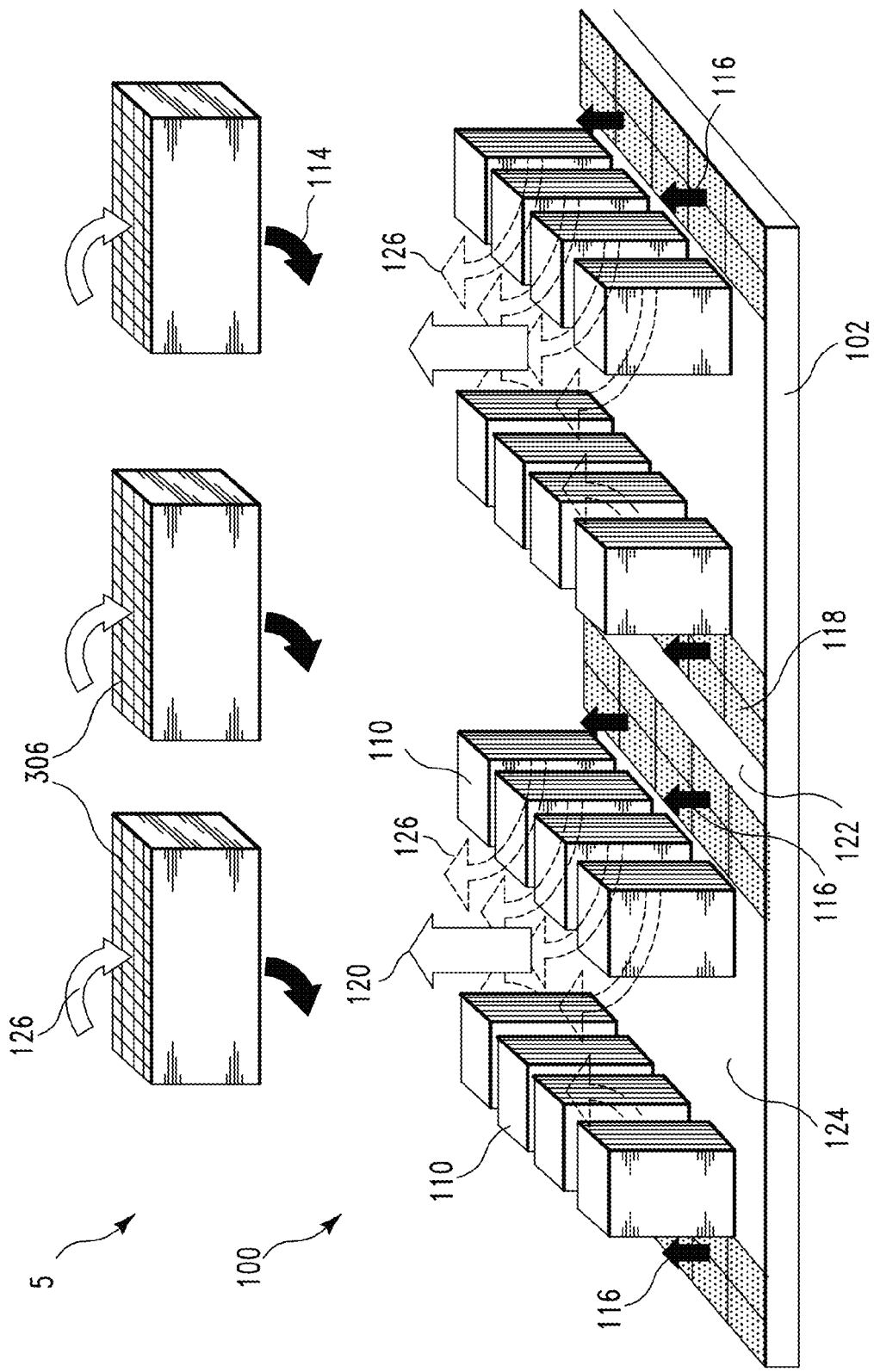
FIG. 1 illustrates side view of a system for managing airflow in a data center, in accordance with embodiments of the present invention.

FIG. 1 illustrates a perspective view of a system 5 for managing airflow in a data center 100, in accordance with embodiments of the present invention. Although system 5 is described with respect to datacenter 100 (i.e., a room comprising multiple computers/servers storing data), note that system 5 may be associated with respect to any type of room or building comprising any type of electro/mechanical/exothermic devices. Data center 100 comprises adjacent IT equipment racks 110 (comprising any type of electro/mechanical/exothermic devices such as, inter alia, computers, etc) located on a raised-floor 102 and placed in rows face to face or back to back in order to create alternate warm (or hot) aisles 124 and cold aisles 122. Warm air flowing through data center 100 is indicated by light arrows 120 and 126 and cooled air flowing through data center 100 is indicated by dark arrows 114 and 116. Cold air 116 directed under raised-floor 102 by a sub-floor cooling system is provided in cold aisles 122 in between adjacent rack rows facing each other through perforated floor tiles 118 (i.e., comprising an airflow register that includes a device for modifying or restricting an airflow of cold air 116) and is directed through a front of each of equipment racks 110. The cold air is collected by cooling fans of the electro/mechanical/exothermic devices in the equipment racks 110 and is exhausted (as warm air 120) at a backside of a rack row in warm aisles 124 where two adjacent rack rows are located back to back. The exhausted warm air 126 is collected in computer room air conditioning units (CRAC) 306 for cooling and is circulated back as cold air 114 to the sub-floor cooling system.

Figure 2:
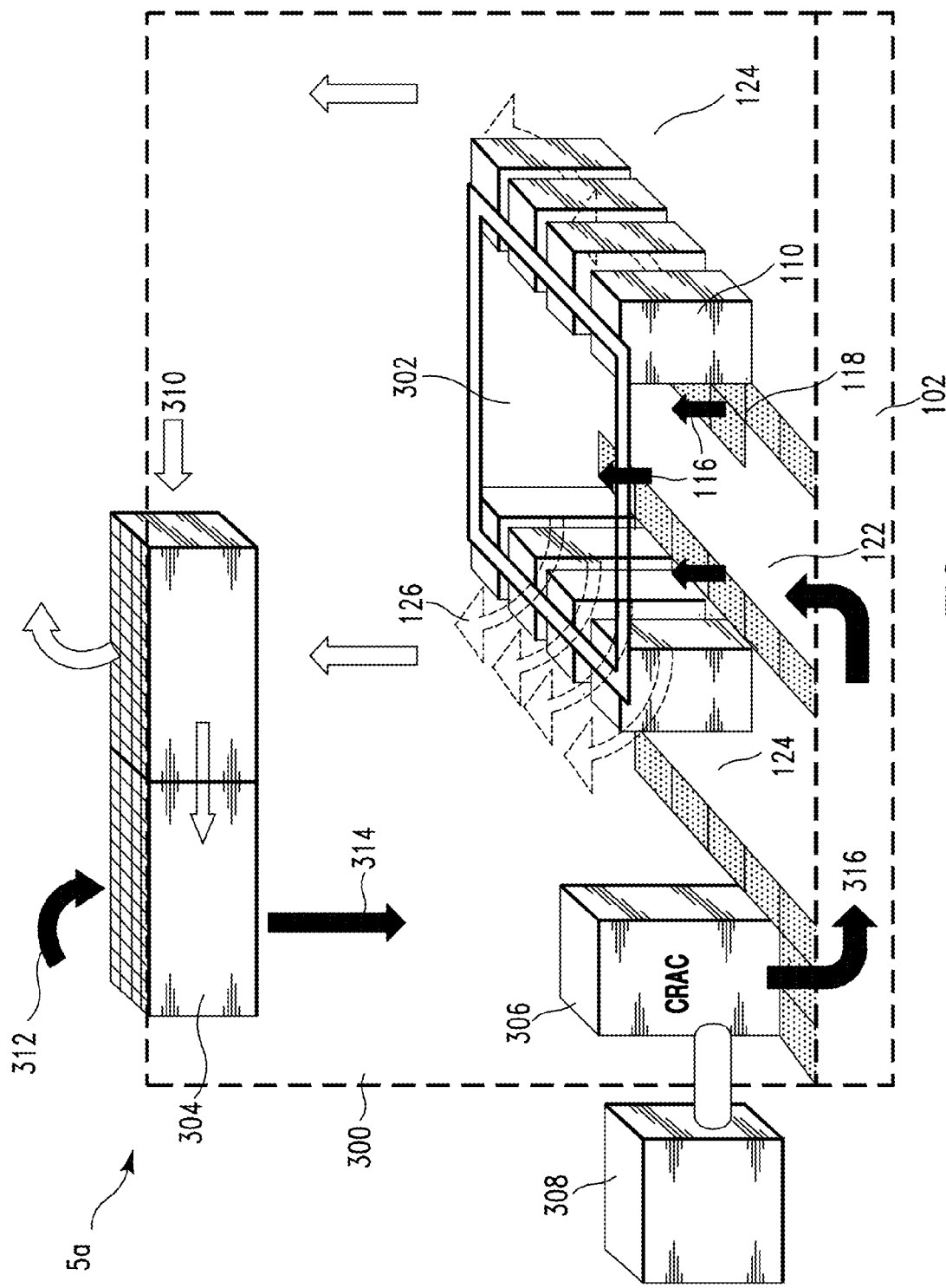
FIG. 2 illustrates a perspective view of an alternative system to the system of FIG. 1, in accordance with embodiments of the present invention.

FIG. 2 illustrates a perspective view of an alternative system 5a to system 5 of FIG. 1, in accordance with embodiments of the present invention. System 5a comprises a data center 300 comprising adjacent IT equipment racks 110 (comprising any type of electro/mechanical/exothermic devices such as, inter alia, computers, etc) located on a raised-floor 102 and placed in rows face to face or back to back in order to create alternate warm aisles 124 and cold aisles 122 as described, supra, with respect to FIG. 1. Warm air flow through data center 300 is indicated by light arrows and cold air flow through data center 300 is indicated by dark arrows. System 5a allows for separation of warm air from cold air by having the warm air being prevented from re-circulating into the cold aisles 122 by using a roof arrangement 302 to isolate the cold aisles 122 from the warm aisles 124. The roof arrangement 302 is disposed over the cold aisles 122. The roof arrangement 302 creates cold air tunnels thereby avoiding warm spots and allowing for maintaining a homogeneous air environment along the cold aisle tunnels. With this arrangement, all cold air produced within the cold aisles goes through the electro/mechanical/exothermic devices and there is no loss of cold air. The roof arrangement 302 may vary in size and material used. In a preferred embodiment, the roof is made of a plastic film extending from one row to an opposite row and covering whole cold aisle 122. The segregation of warm/cold air may be achieved by using different devices such as aluminum structures supporting plastic roofs and side curtains (adjusted to a size of the IT equipment racks 110) and end curtains to close a corridor. The tunnels created allow for maintaining (within the tunnels area) uniform temperature and relative humidity air values. The warm air 310 exhausted from several warm aisles is directed towards the ceiling by an air mixing unit 304. The air mixing unit 304 is preferably located close to the ceiling of the data center 300. The air mixing unit 304 delivers air 314 (comprising a mixture of outside air 312 and the warm air input 310 from the data center room) to a computer room air conditioning unit (CRAC) 306 and/or chilled water apparatus 308 (i.e., for providing chilled water for cooling) for cooling thereby generating a cooled air flow 316 for data center 300 cooling. The CRAC 306 (as further described with respect to FIG. 3) may be coupled to a chilled water apparatus 308 and provides cooled air flow 316 that falls within the temperature and relative humidity values required by the electro/mechanical/exothermic device specifications. The cooled air flow 316 is finally pushed into the sub-floor 102 and blown into the cold aisles 122 through the perforated tiles as previously described. Pressure sensors 400a . . . 400n and a control computing system (as further described with respect to FIGS. 4 and 5) are coupled to the CRAC 306 to measure and uniformly control respectively a volume of cold air 316 and/or chilled water (i.e., from chilled water apparatus 308) necessary to meet required temperature and relative humidity values. Differential pressure readings from the pressure sensors 400a . . . 400n are used to drive a speed of a fan within the CRAC 306 accordingly to create a uniform pressure within each of cold air aisles 122.

Figure 3:
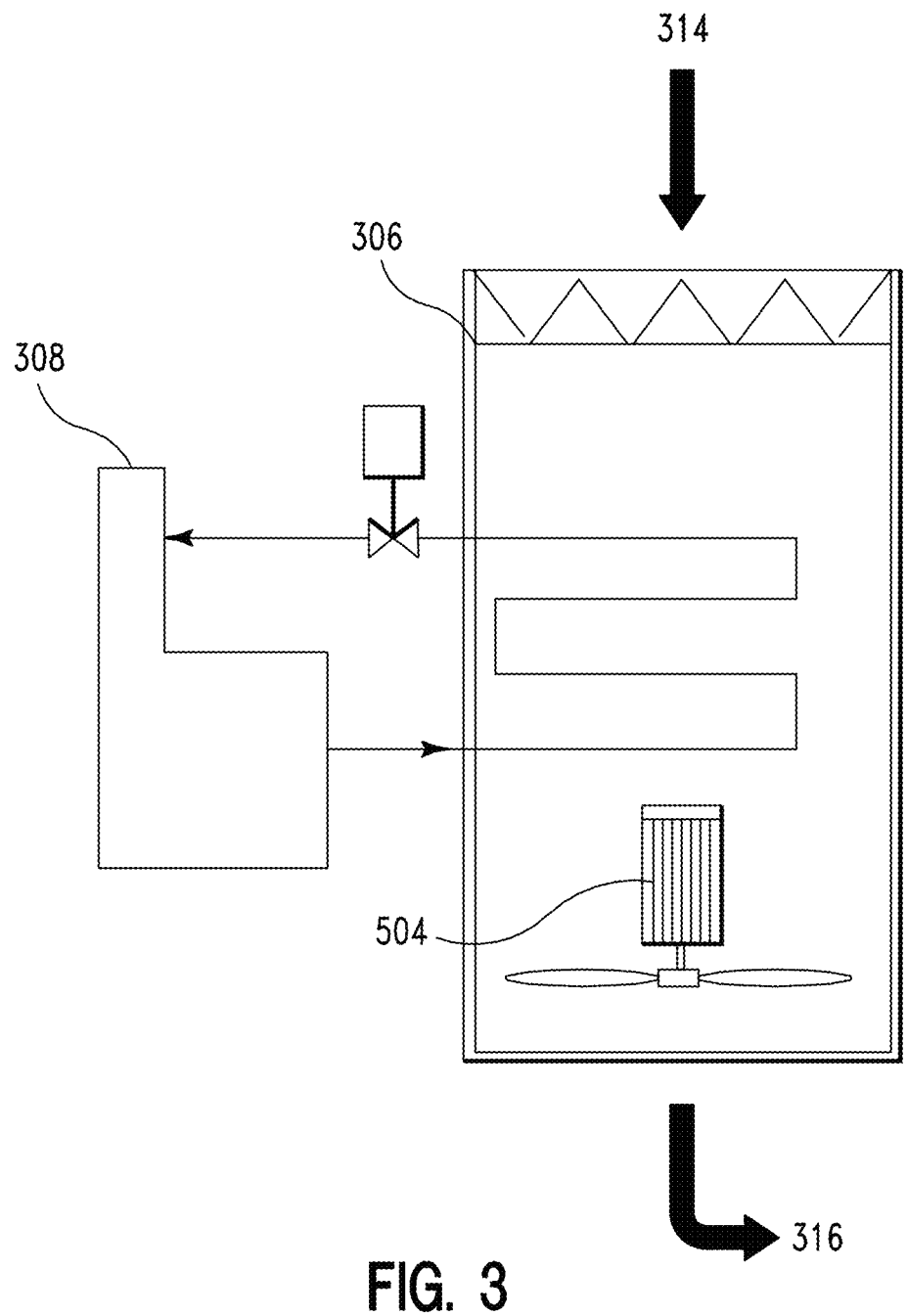
FIG. 3 illustrates an internal side view of the CRAC of FIG. 2, in accordance with embodiments of the present invention.

FIG. 3 illustrates an internal side view of CRAC 306 of FIG. 2, in accordance with embodiments of the present invention. CRAC 306 is configured (in combination with chilled water apparatus 308) to retrieve air 314 and generate cold air 316. The cold air 316 is directed out of the CRAC 306 and into the raised-floor 102 using an internal fan 504. A speed of the fan is controlled by differential pressure readings from the pressure sensors 400a . . . 400n.

Figure 4:
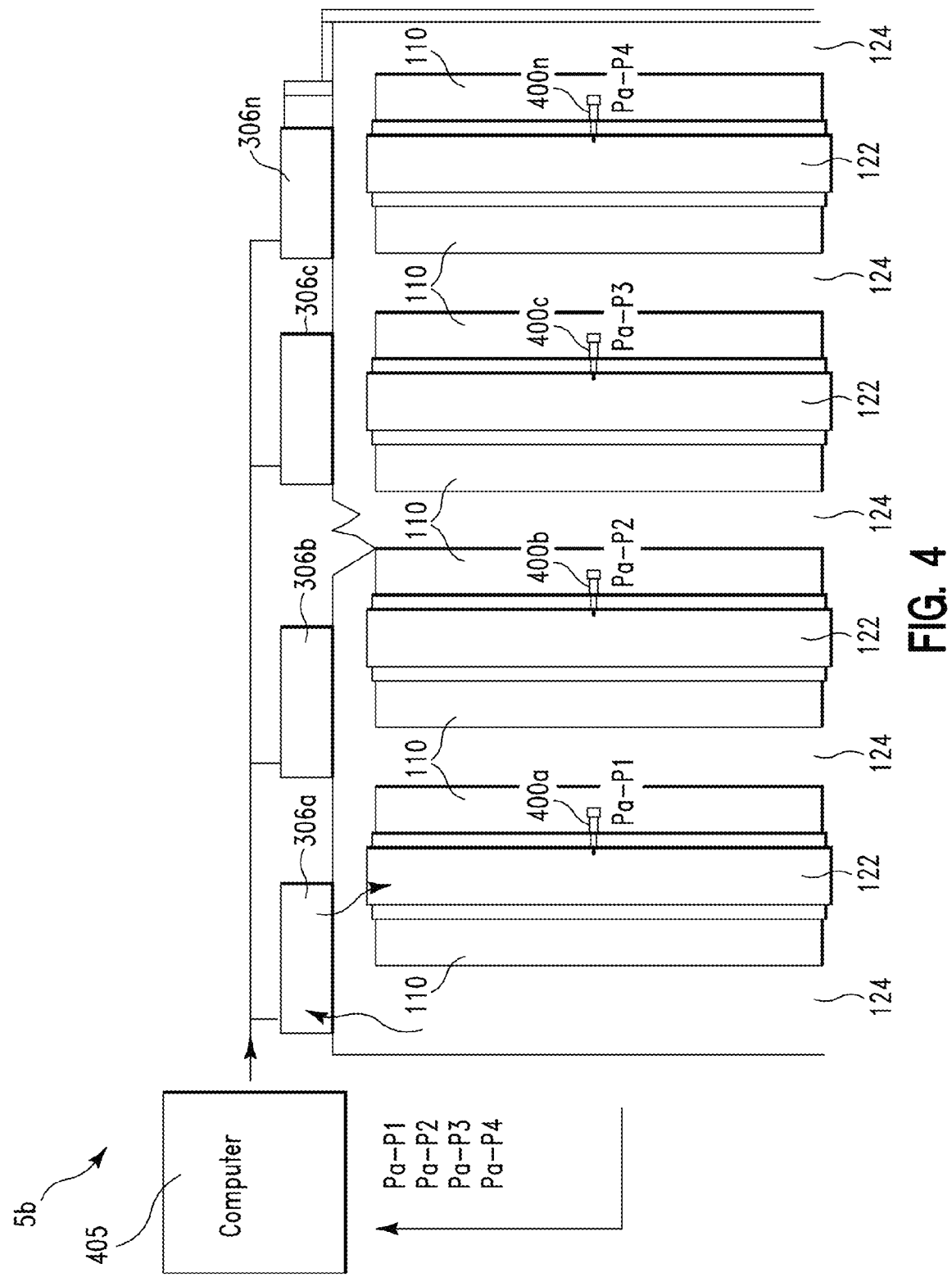
FIG. 4 illustrates a top view of the system of FIG. 2, in accordance with embodiments of the present invention.

FIG. 4 illustrates a top view of an example of an alternative system 5b to systems 5 and 5a of FIGS. 1 and 2, in accordance with embodiments of the present invention. System allows for:

1. Measurement of a differential pressure in each of cold aisles 122.
2. Controlling a fan speed (in each of CRACs/recyclers 306a . . . 306n) to ensure a minimum positive pressure in a cold aisle having a lowest pressure.
3. Adjusting an aisle pressure balance manually or automatically.
4. Detecting and alerting a confinement failure (i.e., air volume increase and pressure decrease).

The computer room in system 5b may be cooled via CRACs/recyclers 306a . . . 306n that cool warm air by directing the warm air through heat exchangers/AC units. After passing through the heat exchangers/AC units, the air may be pass fed with cold water. A temperature of outgoing air from the heat exchangers/AC units may be maintained at a constant level by electrically varying a quantity of water which crosses water drums used to cool the air.

System 5b comprises CRACs/recyclers 306a . . . 306n, associated cold aisles 122 and warm aisles 124, pressure sensors 400a . . . 400n, and a controller computer 405. Each of cold aisles 122 comprises an associated pressure sensor of pressure sensors 400a . . . 400n. Note that the controller computer 405 may be used in any of FIGS. 1-7 for managing airflow (and any other described systems and attributes) in a data center. The pressure sensors 400a . . . 400n generate a differential pressure reading (Pa-P1 . . . Pa-P4) between airflow in the cold aisles 122 (P1 . . . P4) and an ambient pressure (Pa) in the computer room. The differential pressure readings (Pa-P1 . . . Pa-P4) are monitored by the controller computer 405 in order to perform calculations (associated with the differential pressure values) and control a fan speed of at least one fan within CRACs/recyclers 306a . . . 306n based on the calculations. Results of the calculations may determine that a first differential pressure value (associated with one of the cold aisles 122) comprises a lowest pressure value as compared to all other pressure values. In this case the controller computer 405 may:

1. Adjust a fan speed of an associated CRAC/recycler (of CRACs/recyclers 306a . . . 306n) such that the associated cold air aisle space comprises a minimum positive differential pressure value.
2. Adjust an airflow register modifying airflow in the associated cold air aisle space such that the associated cold air aisle space comprises a minimum positive differential pressure value.

Alternatively or additionally the CRAC/recycler(s) 306a . . . 306n may each include a water recycler associated a cold air aisle space and the differential pressure readings (Pa-P1 . . . Pa-P4) are monitored by the controller computer 405 in order to perform calculations (associated with the differential pressure values). Each of the water recyclers comprises a temperature sensor and a water output valve. The temperature sensor is configured to monitor a temperature of an air output for an associated water recycler. The controller computer 405 monitors a consumption of cold water for each water recycler and a temperature for each air output. The calculations are further associated the consumption of cold water for each water recycler and each monitored temperature. Based on the calculations, the controller computer 405 may control each water output valve to control water flow from each of the water recyclers based on the monitored temperatures. Each of the water recyclers may additionally include humidity measurement devices and steam generators associated with cold air aisle spaces 122 and the controller computer 405 may be configured to control output from each steam generator based on humidity measurements from the humidity measurement devices in order to keep a humidity level constant in each of cold air aisle spaces 122.

Figure 5:
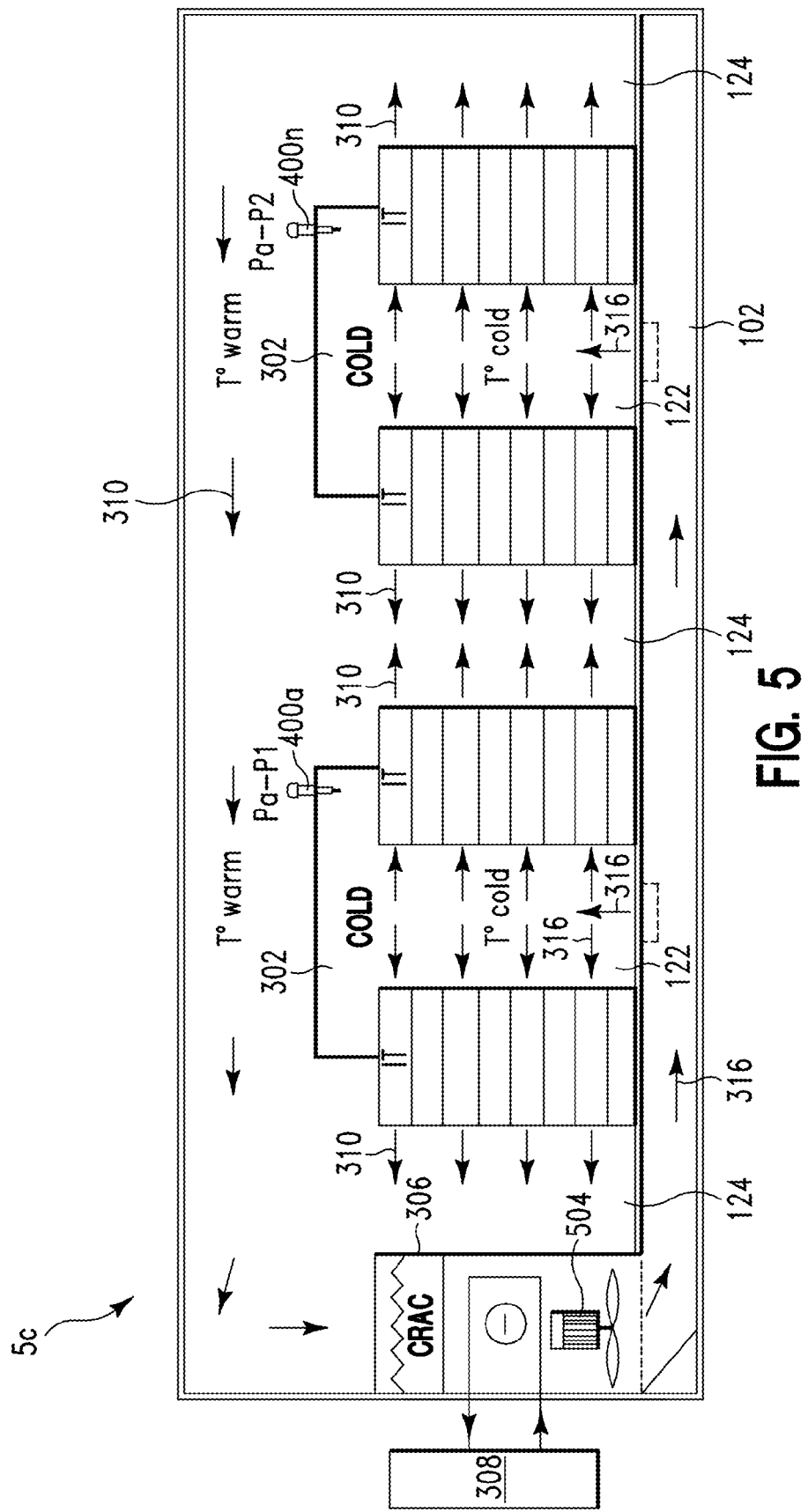
FIG. 5 illustrates a side view of an example of an alternative system to the system of FIG. 4, in accordance with embodiments of the present invention.

FIG. 5 illustrates a side view of an example of an alternative system 5c to system 5b of FIG. 4, in accordance with embodiments of the present invention. In contrast to system 5b of FIG. 4, system 5c comprises a single CRAC/recycler 306 and the pressure sensors 400a . . . 400n are mounted in a roof arrangement 302 for each of the cold aisles 122.

Figure 6:
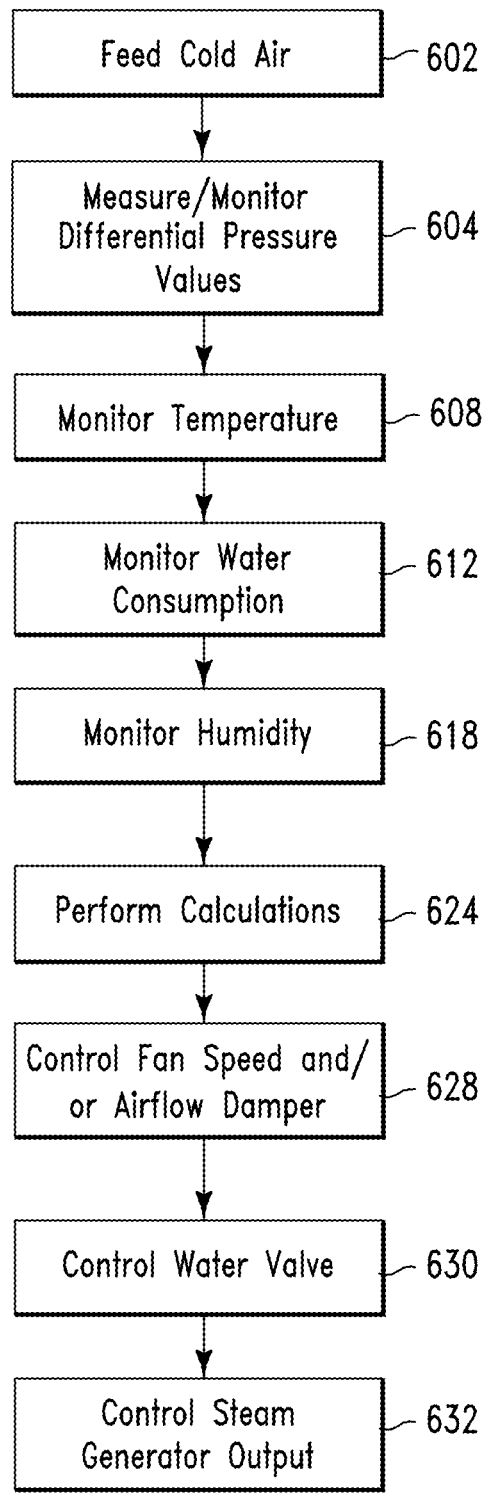
FIG. 6 illustrates an algorithm used by the systems of FIGS. 1-5 for managing airflow and temperature control in a data center, in accordance with embodiments of the present invention.

FIG. 6 illustrates an algorithm used by the systems 5 of FIGS. 1-5 for managing airflow in a data center, in accordance with embodiments of the present invention. In step 602, a cooling system feeds cold air into cold air isle spaces of a data center that includes component racks (each including at least one exothermic apparatus). The cold air flows through the component racks resulting in displacement of warm air from each exothermic apparatus. The warm air flows into warm air aisle spaces and is directed back to the cooling system. In step 604, a plurality of pressure measurement devices (e.g., pressure transducers) measure differential pressure values between the cold air aisle spaces and the warm air aisle spaces. In response, a computing system monitors the differential pressure values. In optional step 608, the cooling system comprises a plurality of water recyclers (each including a temperature sensor and a water output valve) associated with the cold air aisle spaces and each temperature sensor monitors a temperature of an air output for an associated water recycler. In optional step 612, the computing system monitors a consumption of cold water for each of the water recyclers and a temperature for each of the air outputs. In optional step 618, the cooling system comprises humidity measurement devices and steam generators associated with the cold air aisle spaces and the humidity measurement devices generate humidity measurements for monitoring by the computing system. In step 624, the computing system performs calculations associated with the differential pressure values (from step 604), the temperature measurements (from step 608), the water consumption (from step 612), and the humidity measurements (from step 618). In step 628, the computing system controls a fan speed of at least one fan within the cooling system based on results of the said calculations. For example, the calculations may determine that a first differential pressure value (associated with a first cold air aisle space) comprises a lowest pressure value (as compared to all other pressure values) and in response the fan speed of the at least one fan is adjusted such that the first cold air aisle space comprises a minimum positive differential pressure value. The computing system may additionally or alternatively control an airflow register allowing for modification of an airflow such that the first cold air aisle space comprises a minimum positive differential pressure value. In step 630, the computing system may control each water output valve to control water flow from each water recycler based on each of the temperature measurements (from step 608). In step 632, the computing system controls output from each steam generator based on the humidity measurements from said humidity measurement devices (from step 618) in order to keep a humidity level constant in each of the cold air aisle spaces and step 604 is repeated.

Figure 7:
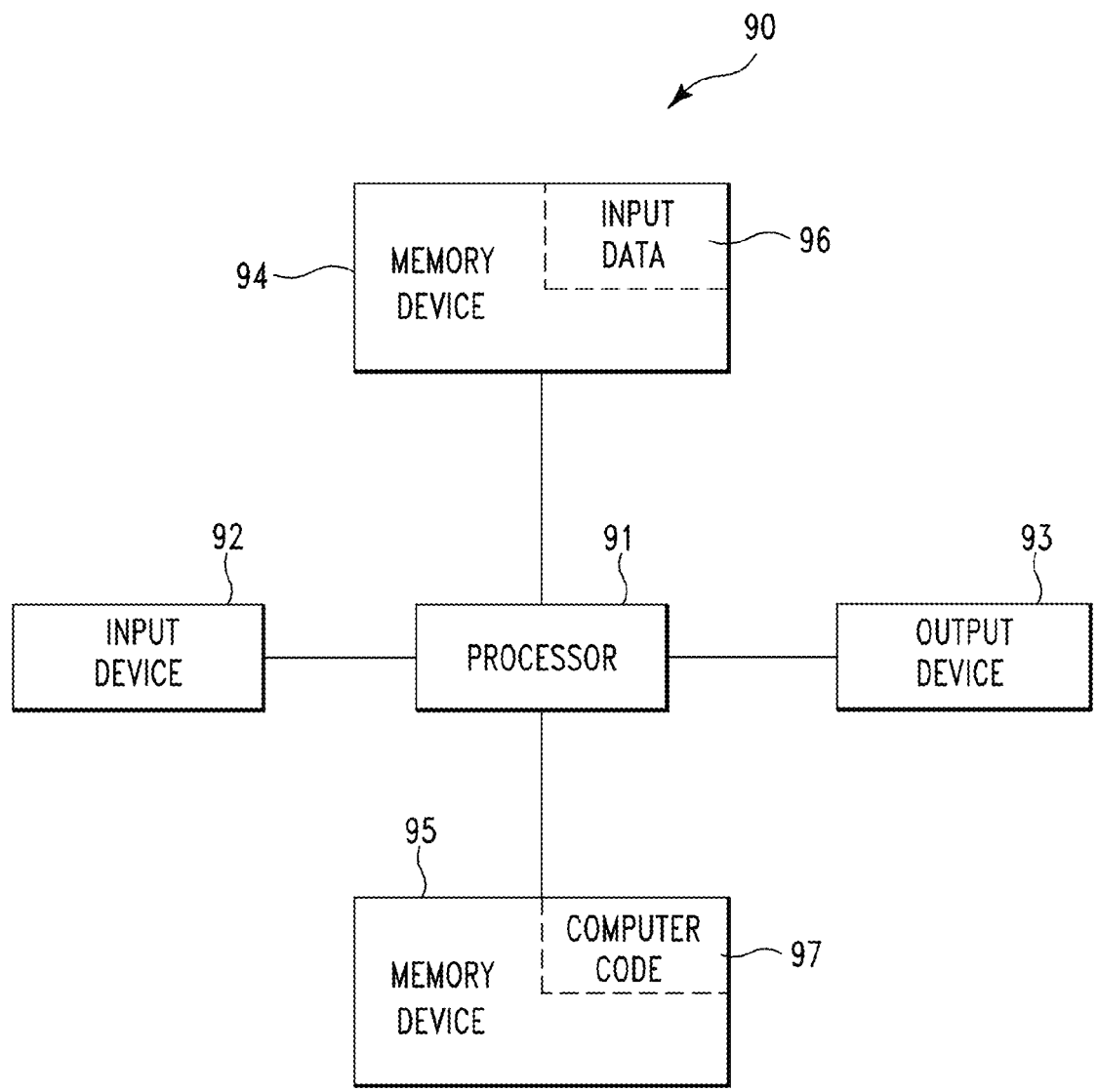
FIG. 7 illustrates a computer apparatus used for managing airflow and fire suppression control in a data center, in accordance with embodiments of the present invention.

FIG. 7 illustrates a computer apparatus 90 (e.g., controller computer 405 in FIG. 4) used for managing airflow (or other systems) in a data center, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a software application, a mouse, etc. The output device 93 may be, inter alia, a printer, a plotter, a computer screen, a magnetic tape, a removable hard disk, a floppy disk, a software application, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes algorithms (e.g., the algorithm of FIG. 6) for managing airflow (or other systems) in a data center. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 7) may comprise the algorithm of FIG. 6 and may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise the computer usable medium (or said program storage device).

Still yet, any of the components of the present invention could be created, integrated, hosted, maintained, deployed, managed, serviced, etc. by a service provider who offers to for manage airflow (or other systems) in a data center. Thus the present invention discloses a process for deploying, creating, integrating, hosting, maintaining, and/or integrating computing infrastructure, comprising integrating computer-readable code into the computer system 90, wherein the code in combination with the computer system 90 is capable of performing a method for managing airflow (or other systems) in a data center. In another embodiment, the invention provides a method that performs the process steps of the invention on a subscription, advertising, and/or fee basis. That is, a service provider, such as a Solution Integrator, could offer to manage airflow (or other systems) in a data center. In this case, the service provider can create, maintain, support, etc. a computer infrastructure that performs the process steps of the invention for one or more customers. In return, the service provider can receive payment from the customer(s) under a subscription and/or fee agreement and/or the service provider can receive payment from the sale of advertising content to one or more third parties.

While FIG. 7 shows the computer system 90 as a particular configuration of hardware and software, any configuration of hardware and software, as would be known to a person of ordinary skill in the art, may be utilized for the purposes stated supra in conjunction with the particular computer system 90 of FIG. 7. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A system comprising:
   a plurality of component racks located within a structure, wherein each component rack of said plurality of component racks comprises at least one exothermic apparatus, wherein said structure comprises a plurality of warm air aisle spaces and a plurality of cold air aisle spaces located between said plurality of component racks;
   a cooling system within said structure, wherein said cooling system is configured to feed cold air into each cold air aisle space of said plurality of cold air isle spaces, wherein said cold air flows through said component racks resulting in displacement of warm air from each said at least one exothermic apparatus, and wherein said warm air flows into said plurality of warm air aisle spaces and is directed back to said cooling system;
   a plurality of pressure measurement devices configured to measure differential pressure values between said plurality of cold air aisle spaces and said plurality of warm air aisle spaces;
   a computing system configured to monitor said differential pressure values, perform calculations associated with said differential pressure values, and control a fan speed of at least one fan within said cooling system based on said calculations; and
   an alarm system configured to notify a user if any of said pressure values exceeds a predetermined threshold.

2. The system of claim 1, wherein said calculations determine that a first differential pressure value of said differential pressure values comprises a lowest pressure value as compared to all other pressure values of said differential pressure values, wherein said first differential pressure value is associated with a first cold air aisle space of said plurality of cold air isle spaces, and wherein said computing system is configured to adjust the fan speed of said at least one fan such that said first cold air aisle space comprises a minimum positive differential pressure value.

3. The system of claim 1, wherein said calculations determine that a first differential pressure value of said differential pressure values comprises a lowest differential pressure value as compared to all other differential pressure values of said differential pressure values, wherein said calculations further determine that a last differential pressure value of said differential pressure values comprises a highest differential pressure value as compared to all other differential pressure values of said differential pressure values, wherein said first differential pressure value is associated with a first cold air aisle space of said plurality of cold air isle spaces, wherein said last differential pressure value is associated with last cold air aisle space of said plurality of cold air isle spaces, and wherein said computing system is configured to adjust an airflow register modifying an airflow in said first cold air aisle space and said last cold air aisle space such that said first cold air aisle space and said last cold air aisle space each comprise a minimum difference of a positive differential pressure value.

4. The system of claim 1, wherein said cooling system comprises a plurality of water recyclers, wherein each water recycler of said plurality of water recyclers is associated with a different cold air aisle space of said plurality of cold air aisle spaces, wherein each said water recycler comprises a temperature sensor and a water output valve, wherein each said temperature sensor is configured to monitor a temperature of each an air output for an associated water recycler of said plurality of water recyclers, wherein said computing system is further configured to monitor a consumption of cold water for each said water recycler and a temperature for each said air output, and wherein said calculations are further associated with said consumption of cold water for each said water recycler and each said temperature.

5. The system of claim 4, wherein said computing system is further configured to control each said water output valve to control water flow from each said water recycler based on each said temperature.

6. The system of claim 4, wherein said cooling system further comprises humidity measurement devices and steam generators associated with said plurality of cold air aisle spaces, and wherein said computing system is further configured to control output from each steam generator of said steam generators based on humidity measurements from said humidity measurement devices in order to keep a humidity level constant in each of said plurality of cold air aisle spaces.

7. The system of claim 1, wherein said cooling system comprises a plurality of cooling devices, wherein each cooling device of said plurality of cooling devices is associated with a different cold air aisle space of said plurality of cold air aisle spaces, wherein each said cooling device comprises a fan, and wherein said computing system is configured to control a fan speed of each said fan based on said calculations.

8. The system of claim 7, wherein said calculations determine that a first differential pressure value of said differential pressure values comprises a lowest differential pressure value as compared to all other differential pressure values of said differential pressure values, wherein said first differential pressure value is associated with a first cold air aisle space of said plurality of cold air isle spaces, and wherein said computing system is configured to adjust a first fan speed of a first fan within a first cooling device of said plurality of cooling devices, wherein said first cooling device is associated with said first cold air aisle space, and wherein said first fan speed is adjusted such that said first cold air aisle space comprises a minimum positive differential pressure value.

9. The system of claim 8, wherein each said fan comprises a same fan speed.

10. The system of claim 1, wherein said calculations are used to determine cold air leakage values associated with an amount of cold air leakage in cold air isle space of said plurality of cold air isle spaces.

11. The system of claim 1, wherein said at least one exothermic apparatus comprises an electrical apparatus.

12. A method comprising:
   providing a system comprising a plurality of component racks located within a structure, a cooling system within said structure, a plurality of pressure measurement devices within said structure, an alarm system, and a computing system connected to said plurality of pressure measurement devices, wherein each component rack of said plurality of component racks comprises at least one exothermic apparatus, wherein said structure comprises a plurality of warm air aisle spaces and a plurality of cold air aisle spaces located between said plurality of component racks;
   feeding, by said cooling system, cold air into each cold air aisle space of said plurality of cold air isle spaces, wherein said cold air flows through said component racks resulting in displacement of warm air from each said at least one exothermic apparatus, and wherein said warm air flows into said plurality of warm air aisle spaces and is directed back to said cooling system;

measuring, by said plurality of pressure measurement devices, differential pressure values between said plurality of cold air aisle spaces and said plurality of warm air aisle spaces;

monitoring, by said computing system, said differential pressure values;

performing, by said computing system, calculations associated with said differential pressure values;

controlling, by said computing system, a fan speed of at least one fan within said cooling system based on said calculations; and notifying, by said computing system executing said alarm system, a user if any of said pressure values exceeds a predetermined threshold.

13. The method of claim 12, wherein said calculations determine that a first differential pressure value of said differential pressure values comprises a lowest pressure value as compared to all other pressure values of said differential pressure values, wherein said first differential pressure value is associated with a first cold air aisle space of said plurality of cold air isle spaces, and wherein said method further comprises:

adjusting, by said computing system, the fan speed of said at least one fan such that said first cold air aisle space comprises a minimum positive differential pressure value.

14. The method of claim 12, wherein said calculations determine that a first differential pressure value of said differential pressure values comprises a lowest differential pressure value as compared to all other differential pressure values of said differential pressure values, wherein said calculations further determine that a last differential pressure value of said differential pressure values comprises a highest differential pressure value as compared to all other differential pressure values of said differential pressure values, wherein said first differential pressure value is associated with a first cold air aisle space of said plurality of cold air isle spaces, wherein said last differential pressure value is associated with last cold air aisle space of said plurality of cold air isle spaces, and wherein said method further comprises:

adjusting by said computing system, an airflow register allowing for a modification of an airflow in said first cold air aisle space and said last cold air aisle space such that said first cold air aisle space and said last cold air aisle space each comprise a minimum difference of a positive differential pressure value.

15. The method of claim 12, wherein said cooling system comprises a plurality of water recyclers, wherein each water recycler of said plurality of water recyclers is associated with a different cold air aisle space of said plurality of cold air aisle spaces, wherein each said water recycler comprises a temperature sensor and a water output valve, and wherein said method further comprises:

monitoring, by each said temperature sensor, a temperature of each an air output for an associated water recycler of said plurality of water recyclers; and monitoring, by said computing system, a consumption of cold water for each said water recycler and a temperature for each said air output, wherein said calculations are further associated with said consumption of cold water for each said water recycler and each said temperature.

16. The method of claim 15, further comprising:
controlling, by said computing system, each said water output valve to control water flow from each said water recycler based on each said temperature.

17. The method of claim 15, wherein said cooling system further comprises humidity measurement devices and steam generators associated with said plurality of cold air aisle spaces, and wherein said method further comprises:

controlling, by said computing system, an output from each steam generator of said steam generators based on humidity measurements from said humidity measurement devices in order to keep a humidity level constant in each of said plurality of cold air aisle spaces.

18. The method of claim 12, wherein said cooling system comprises a plurality of cooling devices, wherein each cooling device of said plurality of cooling devices is associated with a different cold air aisle space of said plurality of cold air aisle spaces, wherein each said cooling device comprises a fan, and wherein said method further comprises:

controlling, by said computing system, a fan speed of each said fan based on said calculations.

19. The method of claim 12, wherein said calculations determine that a first differential pressure value of said differential pressure values comprises a lowest differential pressure value as compared to all other differential pressure values of said differential pressure values, wherein said first differential pressure value is associated with a first cold air aisle space of said plurality of cold air isle spaces, and wherein said method further comprises:

adjusting, by said computing system, a first fan speed of a first fan within a first cooling device of said plurality of cooling devices, wherein said first cooling device is associated with said first cold air aisle space, and wherein said first fan speed is adjusted such that said first cold air aisle space comprises a minimum positive differential pressure value.

20. The method of claim 18, wherein each said fan comprises a same fan speed.

21. The method of claim 12, wherein said calculations are used to determine cold air leakage values associated with an amount of cold air leakage in cold air isle space of said plurality of cold air isle spaces.

22. The method of claim 12, further comprising:
providing a process for supporting computer infrastructure, said process comprising providing at least one support service for at least one of creating, integrating, hosting, maintaining, and deploying computer-readable code in the computing system, wherein the code in combination with the computing system is capable of performing the method of claim 12.

23. A computer program product, comprising a computer readable hardware storage device storing a computer readable program code, the computer readable program code comprising an algorithm that when executed by a computer processor of a computing system implements a method for controlling a system comprising a plurality of component racks located within a structure, a cooling system within said structure, an alarm system, and a plurality of pressure measurement devices within said structure, wherein each component rack of said plurality of component racks comprises at least one exothermic apparatus, and wherein said structure comprises a plurality of warm air aisle spaces and a plurality of cold air aisle spaces located between said plurality of component racks, said method comprising:

feeding, by said cooling system, cold air into each cold air aisle space of said plurality of cold air isle spaces, wherein said cold air flows through said component racks resulting in displacement of warm air from each said at least one exothermic apparatus, and wherein said warm air flows into said plurality of warm air aisle spaces and is directed back to said cooling system;

measuring, by said plurality of pressure measurement devices, differential pressure values between said plurality of cold air aisle spaces and said plurality of warm air aisle spaces, wherein said computing system is connected to said plurality of pressure measurement devices;

monitoring, by said computing system, said differential pressure values;

performing, by said computing system, calculations associated with said differential pressure values;

controlling, by said computing system, a fan speed of at least one fan within said cooling system based on said calculations; and notifying, by said computing system executing said alarm system, a user if any of said pressure values exceeds a predetermined threshold.

\* \* \* \* \*